(12) United States Patent
Hao et al.

(10) Patent No.: US 10,460,978 B2
(45) Date of Patent: Oct. 29, 2019

(54) BOLTLESS SUBSTRATE SUPPORT ASSEMBLY

(71) Applicant: Lam Research Corporation, Fremont, CA (US)

(72) Inventors: Fangli Hao, Cupertino, CA (US); Yuehong Fu, Fremont, CA (US); Zhigang Chen, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 335 days.

(21) Appl. No.: 15/452,976

(22) Filed: Mar. 8, 2017

(65) Prior Publication Data

US 2018/0261492 A1    Sep. 13, 2018

(51) Int. Cl.
*H01L 21/67* (2006.01)
*H01L 21/687* (2006.01)
*H01J 37/32* (2006.01)
*C23C 16/458* (2006.01)
*C23C 16/505* (2006.01)
*H01L 21/683* (2006.01)

(52) U.S. Cl.
CPC .... *H01L 21/68742* (2013.01); *C23C 16/4581* (2013.01); *C23C 16/4584* (2013.01); *C23C 16/505* (2013.01); *H01J 37/32082* (2013.01); *H01J 37/32715* (2013.01); *H01L 21/6831* (2013.01); *H01L 21/68757* (2013.01); *H01L 21/68785* (2013.01); *H01J 2237/334* (2013.01)

(58) Field of Classification Search
CPC ........ H01L 21/67; H01L 21/68; H01L 21/683
See application file for complete search history.

(56) References Cited

U.S. PATENT DOCUMENTS

| 4,416,561 A | 11/1983 | Fischer |
| 6,395,363 B1 | 5/2002 | Ballance et al. |
| 2010/0003824 A1 | 1/2010 | Kadkhodayan et al. |
| 2010/0109263 A1 | 5/2010 | Jun et al. |

(Continued)

FOREIGN PATENT DOCUMENTS

| JP | 2009182092 A | 8/2009 |
| JP | 2016-012733 A | 1/2016 |

(Continued)

OTHER PUBLICATIONS

Notification of Transmittal of International Search Report and the Written Opinion of the International Searching Authority dated Jun. 20, 2018 corresponding to International Application No. PCT/US2018/021333, 13 pages.

(Continued)

*Primary Examiner* — Robert M Kunemund

(57) ABSTRACT

A substrate support includes a conductive baseplate arranged to support a ceramic layer. The conductive baseplate includes a first cavity extending along an axis perpendicular to a horizontal plane defined by the conductive baseplate. A coupling assembly is arranged within the first cavity. The coupling assembly includes a gear configured to rotate about the axis. A pin arranged within the first cavity extends along the axis through the gear and into a second cavity below the conductive baseplate. Rotation of the gear causes the pin to move upward or downward relative to the conductive baseplate. The pin is retained within the second cavity when the gear is rotated to cause the pin to move downward into the second cavity.

18 Claims, 9 Drawing Sheets

(56) References Cited

U.S. PATENT DOCUMENTS

| | | |
|---|---|---|
| 2010/0244350 A1 | 9/2010 | Fujisato et al. |
| 2011/0157760 A1 | 6/2011 | Willwerth et al. |
| 2013/0264015 A1 | 10/2013 | Fang et al. |
| 2014/0376148 A1 | 12/2014 | Sasaki et al. |
| 2016/0013026 A1 | 1/2016 | Matsuura et al. |
| 2016/0135252 A1 | 5/2016 | Matyushkin et al. |
| 2016/0276198 A1 | 9/2016 | Anada et al. |

FOREIGN PATENT DOCUMENTS

| | | |
|---|---|---|
| KR | 10-0505035 B1 | 7/2005 |
| KR | 10-1413764 B1 | 7/2014 |
| WO | 2013039718 A1 | 3/2013 |
| WO | 2015009447 A1 | 1/2015 |

OTHER PUBLICATIONS

Notification of Transmittal of International Search Report and the Written Opinion of the International Searching Authority corresponding to International Application No. PCT/US2018/018916 dated May 23, 2018, 12 pages.

Notification of Transmittal of International Search Report and the Written Opinion of the International Searching Authority dated Feb. 14, 2018, 15 pages.

U.S. Appl. No. 15/399,244, filed Jan. 5, 2017, Fangli Hao et al.

U.S. Appl. No. 15/439,109, filed Feb. 22, 2017, Fangli Hao et al.

BOLTLESS SUBSTRATE SUPPORT ASSEMBLY

FIELD

The present disclosure relates to assembly of substrate supports in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be clamped to the ceramic layer during processing. The ceramic layer may be arranged on a conductive (e.g., aluminum) baseplate. The baseplate may be further arranged on an insulative base. For example, a ceramic baseplate may be arranged between a bottom surface of the processing chamber and the conductive baseplate.

SUMMARY

A substrate support includes a conductive baseplate arranged to support a ceramic layer. The conductive baseplate includes a first cavity extending along an axis perpendicular to a horizontal plane defined by the conductive baseplate. A coupling assembly is arranged within the first cavity. The coupling assembly includes a gear configured to rotate about the axis. A pin arranged within the first cavity extends along the axis through the gear and into a second cavity below the conductive baseplate. Rotation of the gear causes the pin to move upward or downward relative to the conductive baseplate. The pin is retained within the second cavity when the gear is rotated to cause the pin to move downward into the second cavity.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
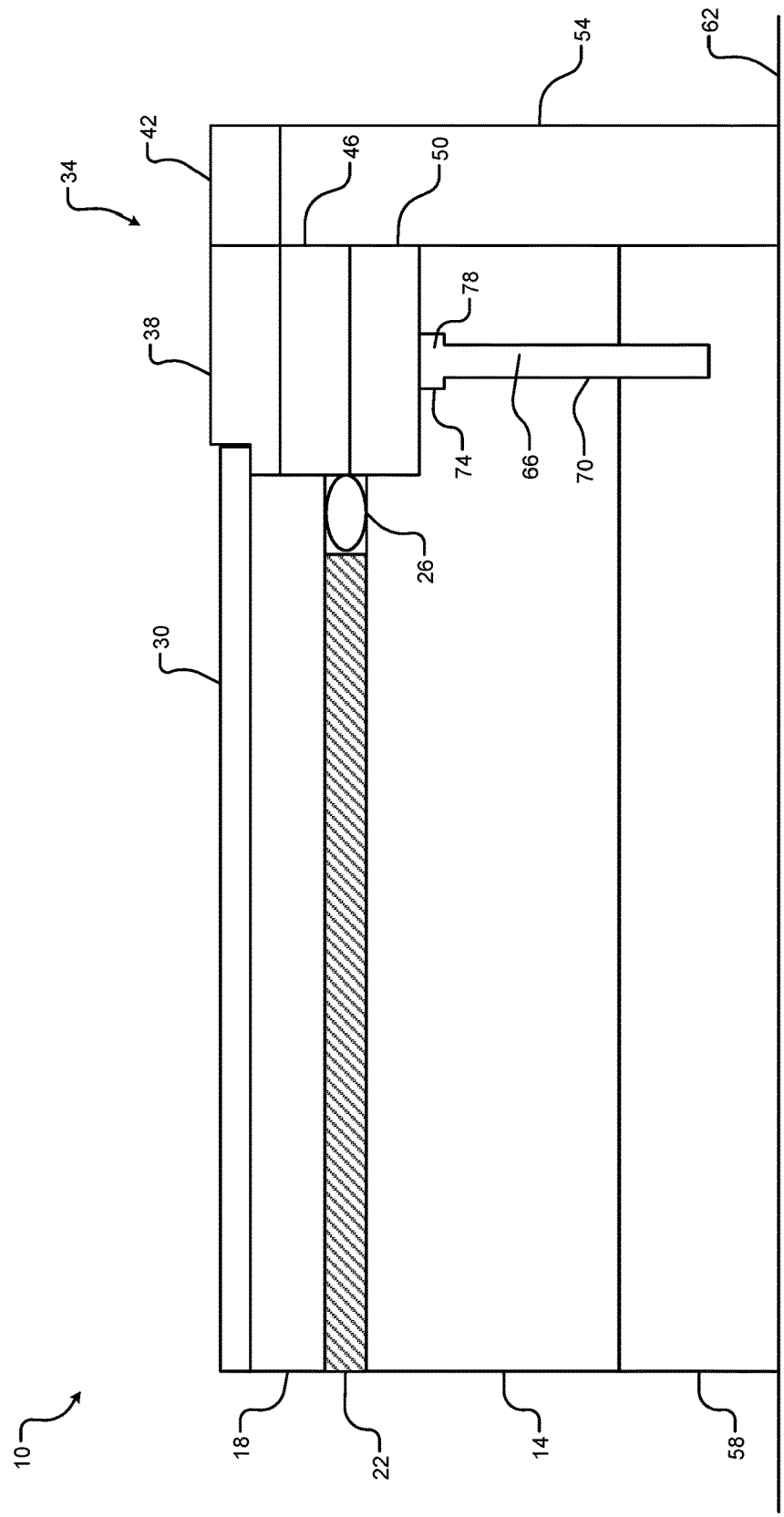
FIG. 1 is an example substrate support including one or more bolts for attaching a conductive baseplate.

FIG. 1 shows a portion of an example substrate support 10 including a baseplate 14 and a ceramic layer 18. For example, the baseplate 14 may correspond to a conductive aluminum baseplate. A bond layer 22 may be formed between the baseplate 14 and the ceramic layer 18. A protective seal 26 may be provided around a perimeter of the bond layer 22 between the ceramic layer 18 and the baseplate 14. A substrate 30 is arranged on the ceramic layer 18.

The substrate support 10 may include an edge ring (e.g., an edge coupling ring) 34. The edge ring 34 includes an inner ring 38 and an outer ring 42. In some examples, the edge ring 34 may be arranged on coupling rings 46 and 50. An outer support structure 54 may surround the substrate support 10. The baseplate 14 may be arranged on an insulative baseplate 58. For example, the insulative baseplate 58 may comprise ceramic. The insulative baseplate is arranged between a bottom surface 62 of a processing chamber and the conductive baseplate 14.

The conductive baseplate 14 may be attached to the insulative baseplate 58 and/or the bottom surface 62 of the processing chamber using a fastener, such as a bolt or screw 66. For example, the bolt 66 may attach the conductive baseplate 14 directly to the insulative baseplate 58 as shown, or may extend through the insulative baseplate 58 into the bottom surface 62 of the processing chamber. For example only, the bolt 66 may be threaded, and a via 70 through the conductive baseplate 14 and/or the insulative baseplate 58 may also be threaded.

An upper end 74 of the via 70 may be configured to accommodate a head 78 of the bolt 66. For example, the head 78 may have a greater diameter than the bolt 66. During processing of the substrate 30, plasma light-up and arcing may be more likely to occur in gaps between various components of the substrate support 10. For example, arcing may occur between the conductive baseplate 14 and other conductive structures, such as the coupling rings 46 and 50. Arcing may also occur within the upper end 74 of the via 70 (e.g., between the bolt 66 and one or more of the conductive baseplate 14 and the coupling ring 50). In other words, the via 70 extends entirely through the conductive baseplate 14, allowing arcing to occur within the upper end 74 of the via 70.

Systems and methods according to the principles of the present disclosure implement an coupling assembly configured to attach a conductive baseplate of a substrate support to a support structure (e.g., an insulative baseplate or a bottom surface of a plasma processing chamber).

Figure 2:
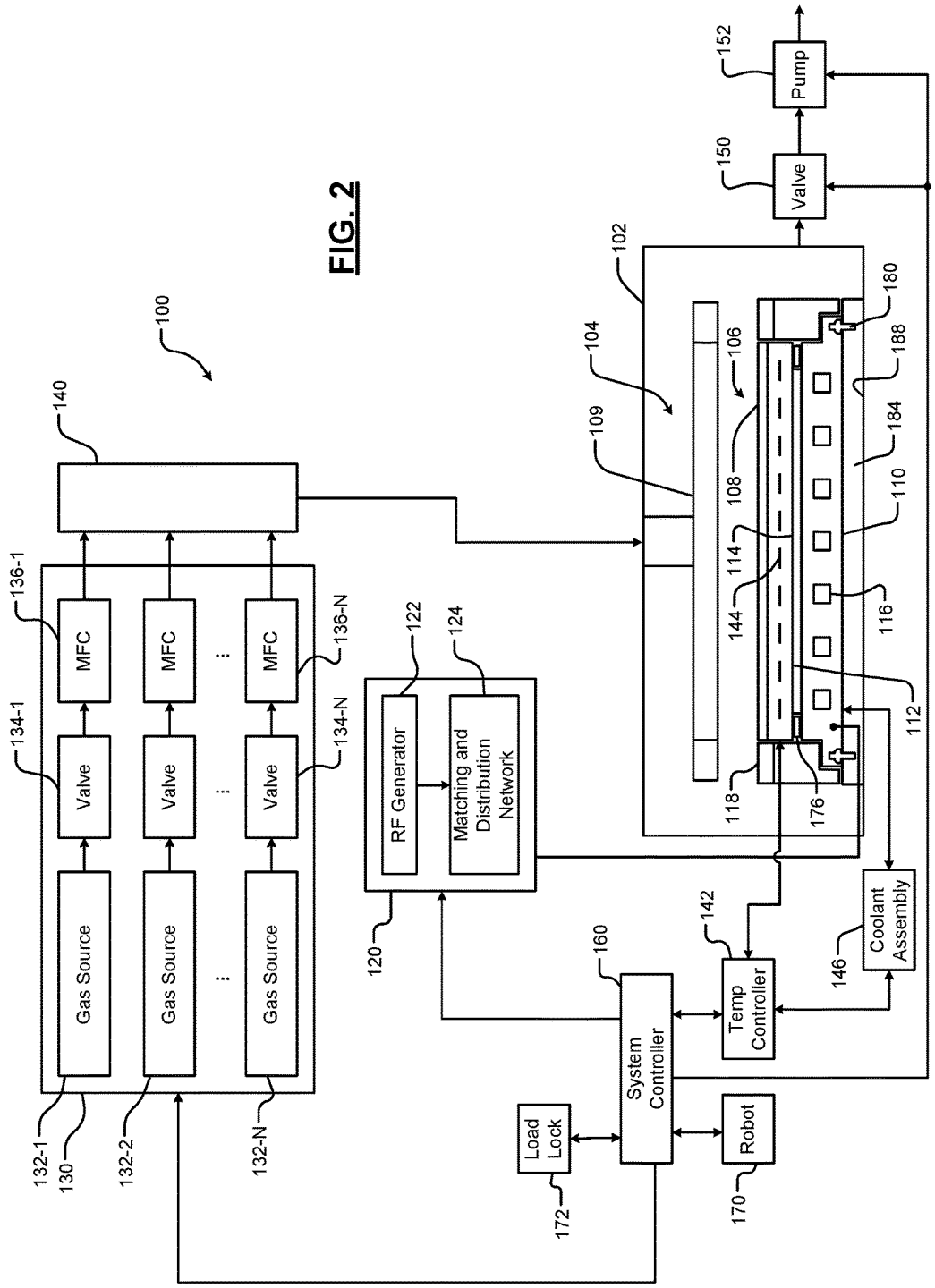
FIG. 2 is a functional block diagram of an example processing chamber including a substrate support according to the present disclosure.

Referring now to FIG. 2, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 of the present disclosure includes one or more mechanical coupling assemblies 180. For example, the coupling assembly 180 is configured to attach the baseplate 110 to an insulative baseplate 184, to a bottom surface 188 of the substrate processing chamber 102, etc. as described below in more detail.

Figure 3A:
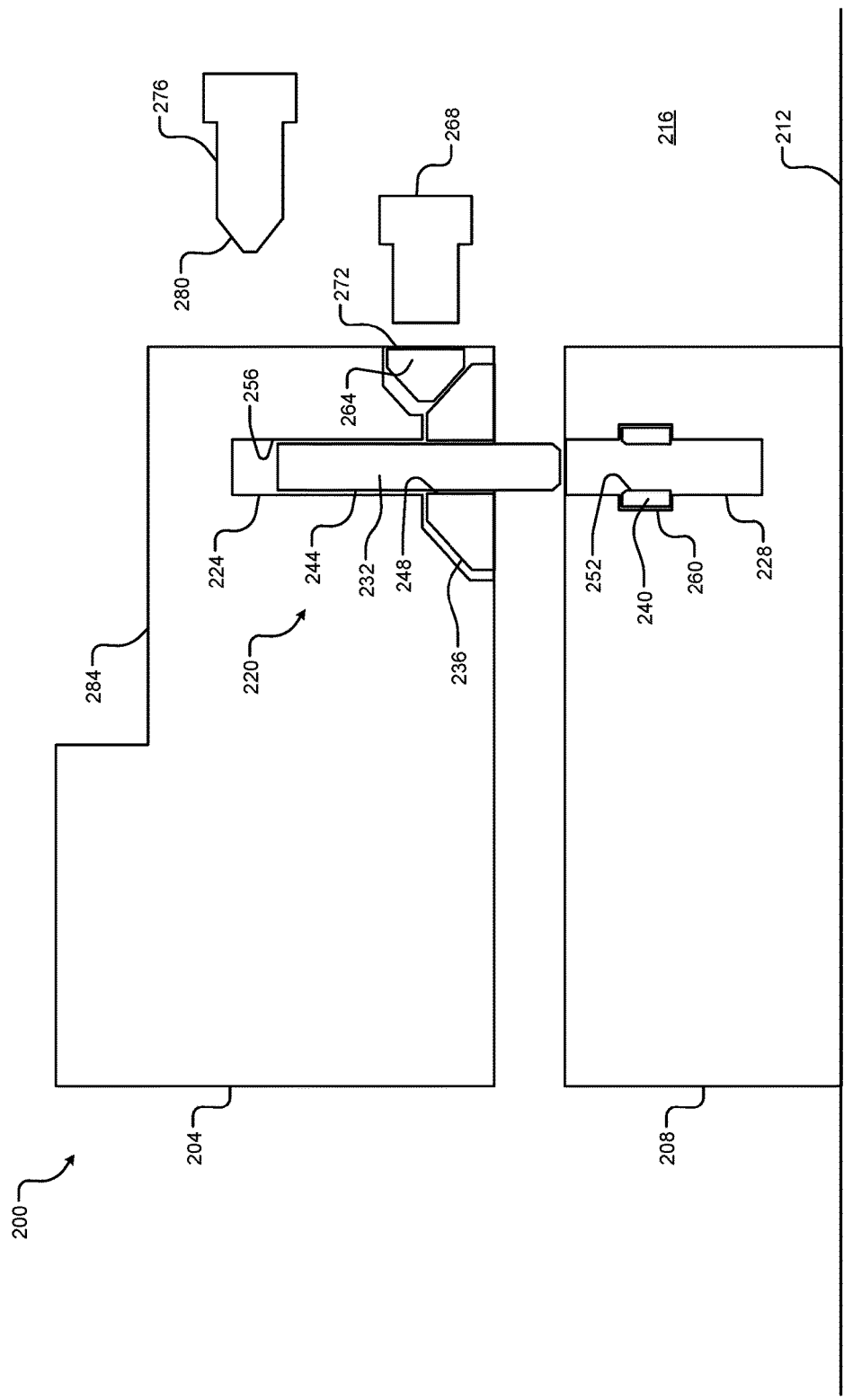
FIGS. 3A and 3B show a substrate support including a first example coupling assembly according to the present disclosure.
Figure 3B:
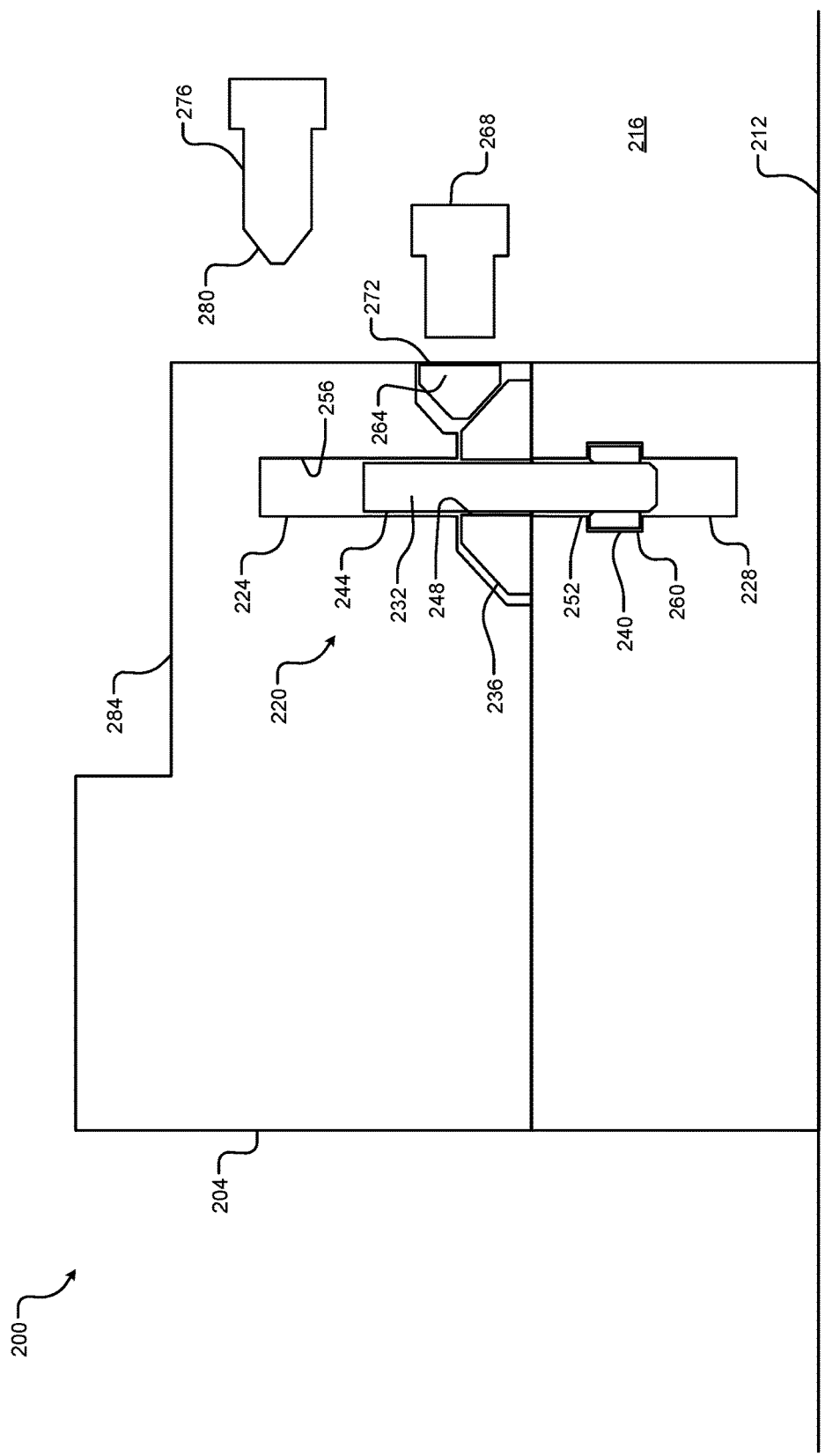

Referring now to FIGS. 3A and 3B, a portion of a substrate support 200 including a conductive baseplate 204 and an insulative baseplate 208 is shown. The substrate support 200 is arranged on a bottom surface 212 of a substrate processing chamber 216. For example purposes, other components of the substrate support 200 (e.g., a ceramic layer, edge coupling ring, etc.) are omitted.

The substrate support 200 includes one or more coupling assemblies 220 arranged within respective cavities 224 and 228 of the baseplates 204 and 208. For example, a plurality of the coupling assemblies 220 may be arranged around a perimeter of the substrate support 200. The coupling assembly 220 includes a pin 232, a gear 236, and a nut 240. As shown, the gear 236 is a bevel gear, but the coupling assembly 220 may implement other suitable types of gears (e.g., a hypoid bevel gear, a miter gear, a face gear, etc.) configured to translate rotational motion of the gear 236 to linear (i.e., up and down) motion of the pin 232. FIG. 3A shows the conductive baseplate 204 positioned above the insulative baseplate 208. FIG. 3B shows the conductive baseplate 204 attached to the insulative baseplate 208 via the coupling assembly 220.

The pin 232 extends through the gear 236. The pin 232 and the gear 236 are axially aligned. For example, the cavities 224 and 228 extend along an axis perpendicular to a horizontal plane defined by the baseplate 204. The pin 232 extends along the axis of the cavities 224 and 228 through the gear 236. Rotation of the gear 236 causes the pin 232 to rotate and move upward into the cavity 224 or downward into the cavity 228 through the nut 240 along a shared axis depending on a direction of rotation of the gear 236. For example, an outer surface 244 of the pin 232, an inner surface 248 of the gear 236, and an inner surface 252 of the nut 240 may be threaded. In some examples, an inner surface 256 of the cavity 224 may be threaded. Accordingly, rotation of the gear 236 causes the threaded inner surface 248 of the gear 236 to engage with the threaded outer surface 244 of the pin 232, thereby causing the pin 232 to rotate and move upward or downward in accordance with the direction of rotation of the gear 236.

When the pin 232 moves downward into the nut 240, the threaded outer surface 244 of the pin 232 engages with the threaded inner surface 252 of the nut 240. The nut 240 is retained (i.e., does not rotate) within the cavity 228. For example, the nut 240 may have a hexagonal or other non-circular shape. Accordingly, the nut 240 does not move upward or downward within the cavity 228. For example, the nut 240 may be retained within a chamber 260, which may also have a hexagonal shape. In this manner, the pin 232 is retained within the each of the cavities 224 and 228 (e.g., by the gear 236 and/or the threaded inner surface 256 of the cavity 224 and by the nut 240 of the cavity 228) as the gear 236 is rotated to mount the baseplate 204 on the baseplate 208.

In one example, the baseplate 204 includes a complementary bevel gear or pinion 264. The pinion 264 engages with the gear 236. Accordingly, rotation of the pinon 264 is translated to the gear 236. For example, the pinion 264 rotates on an axis perpendicular to an axis of the gear 236. In one example, the pinion 264 may be rotated using a removable tool or key 268. For example, the tool 268 may be received within a socket, slot, or other feature on an exposed outer surface 272 of the pinion 264. In other examples, a removable tool 276 including a pinion 280 may be implemented as a single piece.

Figure 3C:
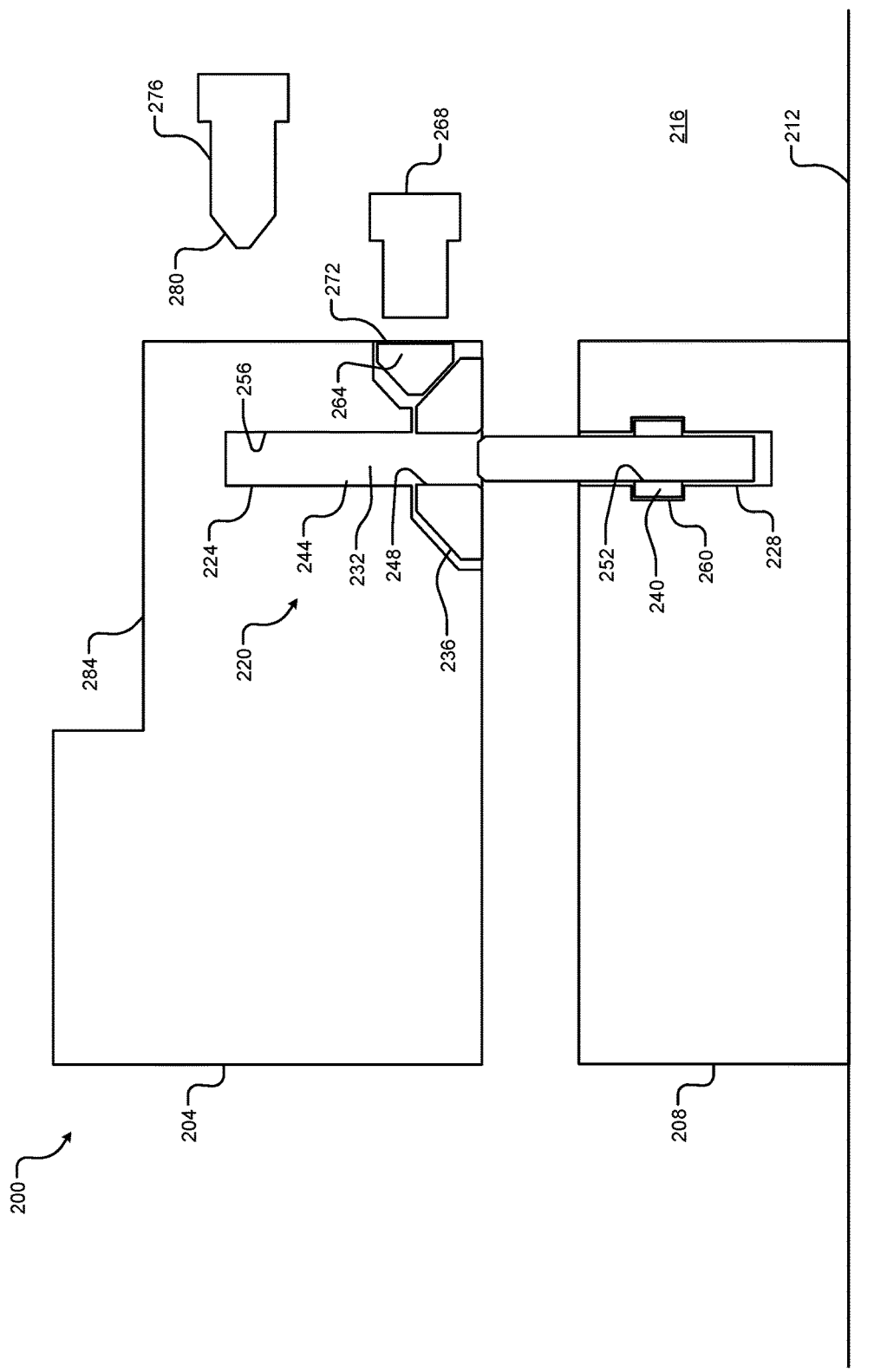
FIGS. 3C and 3D show a substrate support including a second example coupling assembly according to the present disclosure.
Figure 3D:
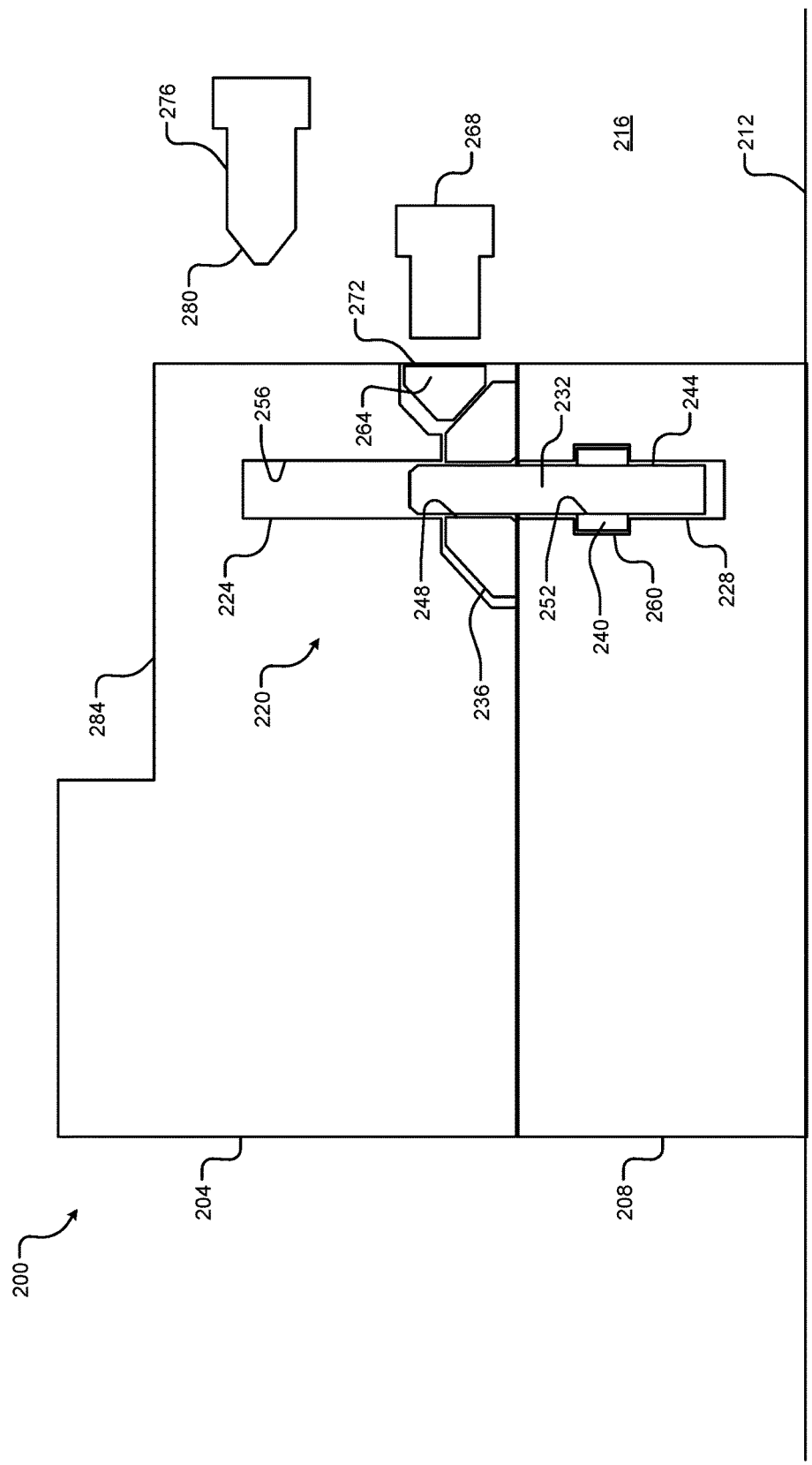

In FIGS. 3C and 3D, the coupling assembly 220 is configured to operate in a manner similar to the coupling assembly 220 as described in FIGS. 3A and 3B. However, when the conductive baseplate 204 is positioned above the insulative baseplate 208 as shown in FIG. 3C, the pin 232 is already retained within the nut 240 in the insulative baseplate 208. In other words, the pin 232 is arranged to face upward from the insulative baseplate 208 instead of downward from the conductive baseplate 204 as shown in FIG. 3A. Accordingly, rotating the gear 236 causes the pin 232 to move upward through the gear 236 and into the cavity 224, thereby drawing the conductive baseplate 204 downward against the insulative baseplate 208. FIG. 3D shows the conductive baseplate 204 attached to the insulative baseplate 208 via the coupling assembly 220 in this manner.

As described above, cavity 224 does not extend to an upper surface 284 of the baseplate 204. In other words, the upper surface 284 of the baseplate 204 does not include an opening into the cavity 224. Accordingly, gaps between the cavity 224, the pin 232, etc. and other components of the substrate support 200 (e.g., edge rings and other structures arranged on the baseplate 204) are eliminated.

Figure 4:
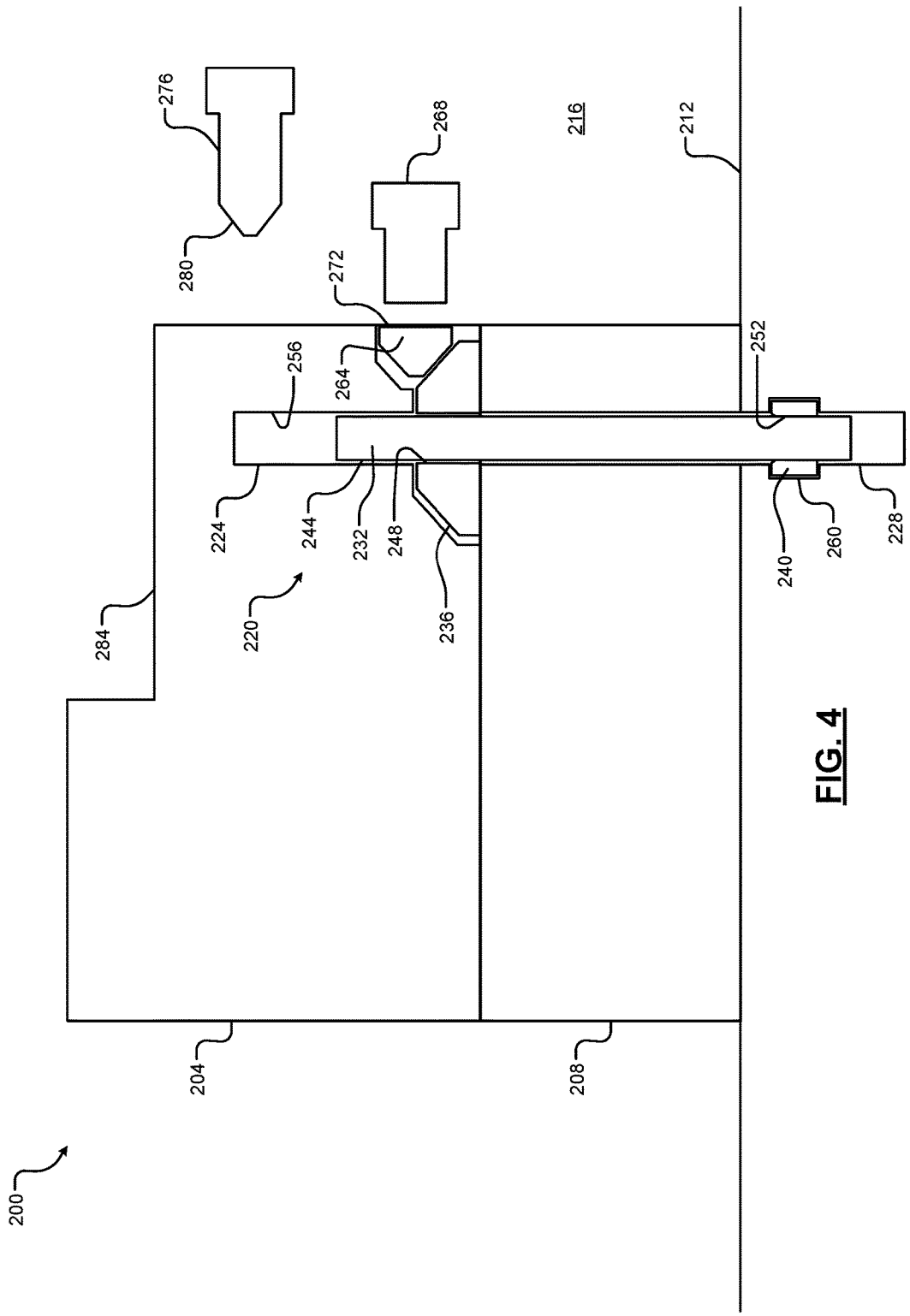
FIG. 4 shows as a substrate support including a third example coupling assembly according to the present disclosure.

FIG. 4 shows another example arrangement of the coupling assembly 220. In this example, cavity extends through the insulative baseplate 208 and below the bottom surface 212 of the processing chamber 216. The chamber 260 and the nut 240 are arranged below the bottom surface 212 (e.g., in a lower wall of the chamber 216). Accordingly, the pin 232 passes entirely through the baseplate 208 and is retained within the nut 240 below the bottom surface 212 of the chamber 216.

Figure 5:
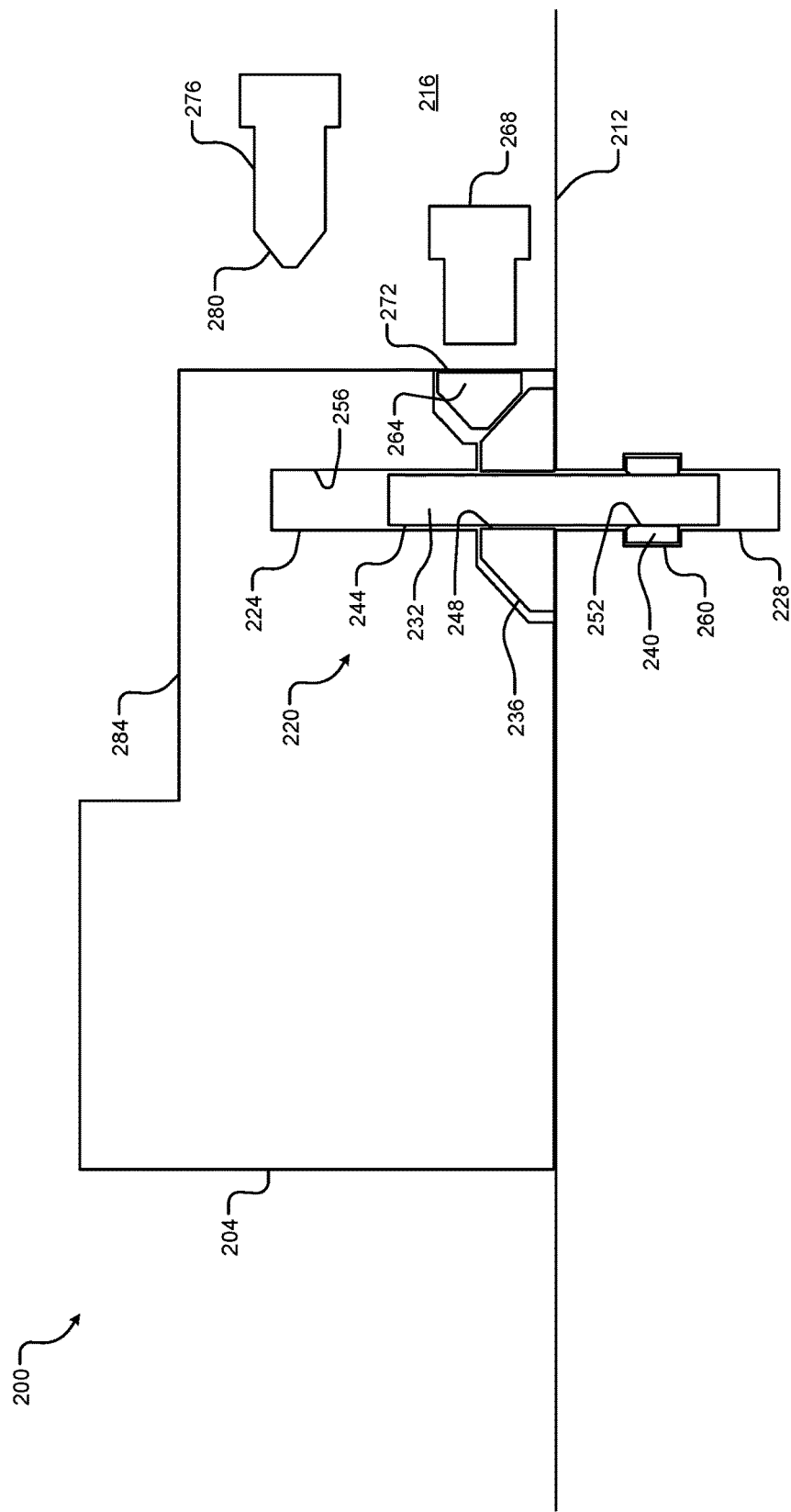
FIG. 5 shows as a substrate support including a fourth example coupling assembly according to the present disclosure.

FIG. 5 shows another example arrangement of the coupling assembly 220. In this example, the conductive baseplate is mounted directly on the bottom surface 212 of the chamber 216 and the insulative baseplate 208 is eliminated. Accordingly, the chamber 260 and the nut 240 are arranged below the bottom surface 212 and the pin 232 is retained within the nut 240 below the bottom surface 212 of the chamber 216 similar to the example shown in FIG. 4.

Figure 6:
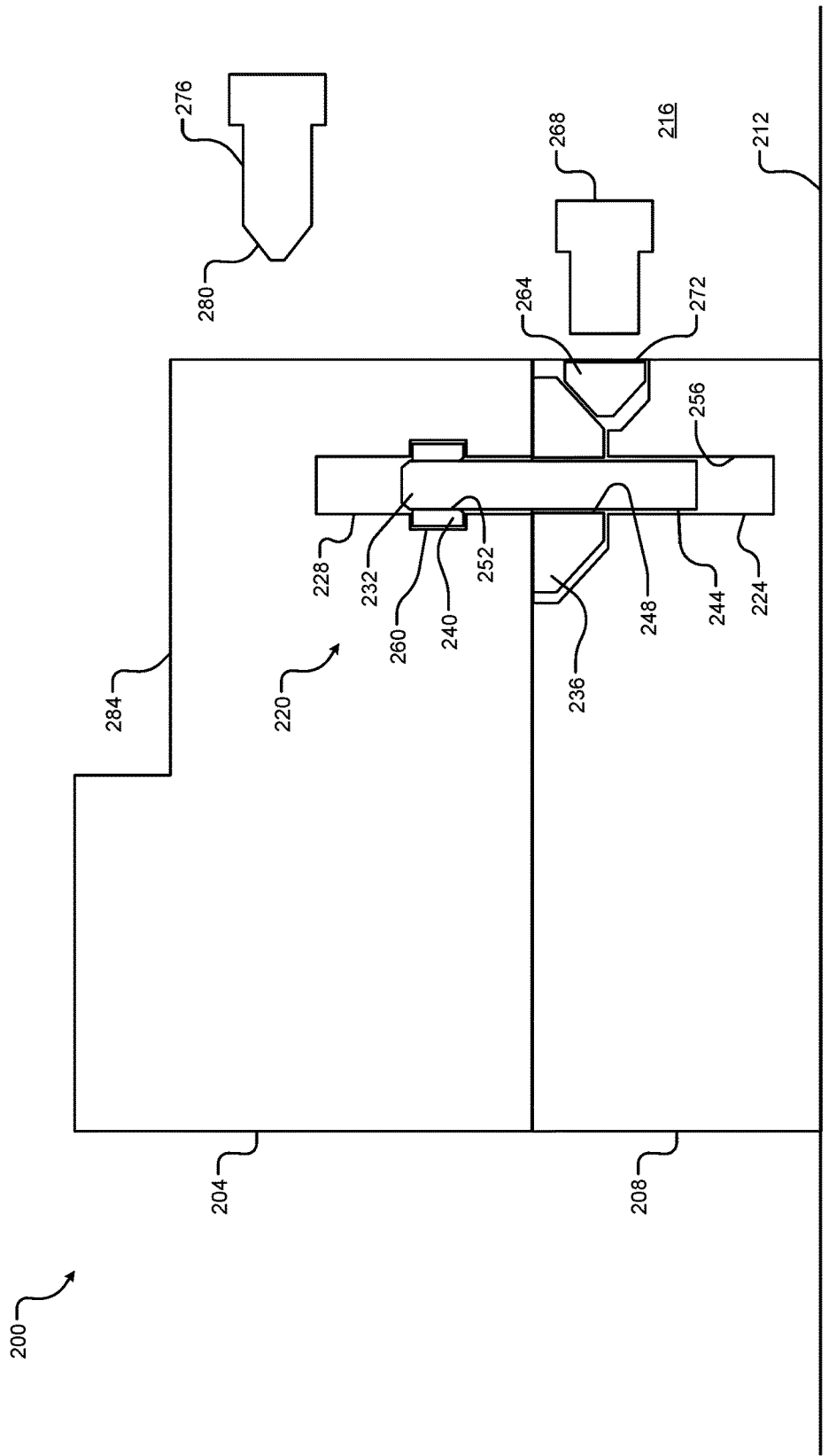
FIG. 6 shows as a substrate support including a fifth example coupling assembly according to the present disclosure.

FIG. 6 shows another example arrangement of the coupling assembly 220. In this example, the orientation of the coupling assembly 220 is reversed (i.e., upside-down) relative to the examples shown in FIGS. 3-5. Accordingly, the gear 236, pinion 264, and cavity 224 are located within the insulative baseplate 208 and the chamber 260 and nut 240 are located within the conductive baseplate 204.

Although several examples are provided, other suitable arrangements of the coupling assembly 220 within the conductive baseplate 204 and/or the insulate baseplate 208 may be implemented.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support, comprising:
   a conductive baseplate arranged to support a ceramic layer, the conductive baseplate including a first cavity extending along an axis perpendicular to a horizontal plane defined by the conductive baseplate; and
   a coupling assembly arranged within the first cavity, the coupling assembly comprising
      a gear arranged within the first cavity and configured to rotate about the axis, and
      a pin arranged within the first cavity, the pin extending along the axis through the gear and into a second cavity below the conductive baseplate, wherein rotation of the gear causes the pin to move upward or downward relative to the conductive baseplate, and wherein the pin is retained within the second cavity when the gear is rotated to cause the pin to move downward into the second cavity, and wherein the pin does not extend to an upper surface of the conductive baseplate.

2. The substrate support of claim 1, wherein the second cavity is located within at least one of (i) an insulative baseplate arranged below the conductive baseplate and (ii) a lower wall of a substrate processing chamber.

3. The substrate support of claim 1, wherein the conductive baseplate is arranged on an insulative baseplate, and wherein the second cavity is located within the insulative baseplate.

4. The substrate support of claim 1, wherein the conductive baseplate is arranged on a bottom surface of a substrate processing chamber, and wherein the second cavity is located below the bottom surface of the substrate processing chamber.

5. The substrate support of claim 1, wherein the conductive baseplate is arranged on an insulative baseplate, wherein the insulative baseplate is arranged on a bottom surface of a substrate processing chamber, and wherein the second cavity extends through the insulative baseplate and below the bottom surface of the substrate processing chamber.

6. The substrate support of claim 1, wherein the second cavity includes a nut, and wherein the pin is retained within the nut in the second cavity.

7. The substrate support of claim 1, wherein rotation of the gear causes rotation of the pin.

8. The substrate support of claim 1, wherein at least one of an outer surface of the pin, an inner surface of the gear, and an inner surface of the first cavity is threaded.

9. The substrate support of claim 1, wherein the gear is a bevel gear.

10. The substrate support of claim 1, wherein the coupling assembly further includes a pinion arranged to interface with the gear, and wherein rotation of the pinion is translated to rotation of the gear.

11. The substrate support of claim 10, wherein the pinion rotates on an axis perpendicular to an axis of the gear.

12. A substrate support, comprising:
 a conductive baseplate arranged to support a ceramic layer, the conductive baseplate including a first cavity extending along an axis perpendicular to a horizontal plane defined by the conductive baseplate;
 an insulative baseplate arranged between the conductive baseplate and a lower wall of a substrate processing chamber, the insulative baseplate including a second cavity; and
 a coupling assembly arranged within the first cavity of the conductive baseplate, the coupling assembly comprising
  a gear arranged within the first cavity and configured to rotate about the axis, and
  a pin arranged within the first cavity, the pin extending along the axis through the gear and into the second cavity of the insulative baseplate, wherein rotation of the gear causes the pin to move upward or downward relative to the conductive baseplate, and wherein the pin is retained within the second cavity when the gear is rotated to cause the pin to move downward into the second cavity, and wherein the pin does not extend to an upper surface of the conductive baseplate.

13. The substrate support of claim 12, wherein the second cavity includes a nut, and wherein the pin is retained within the nut in the second cavity.

14. The substrate support of claim 12, wherein rotation of the gear causes rotation of the pin.

15. The substrate support of claim 12, wherein at least one of an outer surface of the pin, an inner surface of the gear, and an inner surface of the first cavity is threaded.

16. The substrate support of claim 12, wherein the gear is a bevel gear.

17. The substrate support of claim 12, wherein the coupling assembly further includes a pinion arranged to interface with the gear, and wherein rotation of the pinion is translated to rotation of the gear.

18. The substrate support of claim 17, wherein the pinion rotates on an axis perpendicular to an axis of the gear.

* * * * *